United States Patent [19]

Tanida

[11] Patent Number: 5,587,956
[45] Date of Patent: Dec. 24, 1996

[54] SEMICONDUCTOR MEMORY DEVICE HAVING FUNCTION OF GENERATING BOOSTED POTENTIAL

[75] Inventor: Susumu Tanida, Hyogo, Japan

[73] Assignee: Mitsubishi Denki Kabushiki Kaisha, Tokyo, Japan

[21] Appl. No.: 516,077

[22] Filed: Aug. 17, 1995

[30] Foreign Application Priority Data

Nov. 10, 1994 [JP] Japan .................................. 6-276476

[51] Int. Cl.⁶ ............................. G11C 13/00; G11C 8/00
[52] U.S. Cl. ............... 365/226; 365/189.09; 365/230.06; 327/589
[58] Field of Search .............................. 365/226, 189.09, 365/189.07, 230.06; 327/589

[56] References Cited

U.S. PATENT DOCUMENTS

5,361,237  11/1994  Chishiki .............................. 365/230.06
5,406,523   4/1995  Foss et al. ............................... 365/226

*Primary Examiner*—David C. Nelms
*Assistant Examiner*—Huan Hoang
*Attorney, Agent, or Firm*—Lowe, Price, LeBlanc & Becker

[57] ABSTRACT

A level determining circuit performs level determination of a potential of a boosted potential node. A determination control circuit is provided for controlling a level determination timing of the level determining circuit. The determination control circuit supplies a control pulse signal of a long cycle to the level determining circuit when a charge pump is not operating, and supplies the control pulse signal of a short cycle to the level determining circuit when the charge pump is operating. The level determining circuit performs the level determination in accordance with a timing defined by the control pulse signal supplied from the determination control circuit. In response to the result of determination, the charge pump is driven. In this manner, a power consumption of a semiconductor memory device can be reduced, and overshoot of a boosted potential of the semiconductor memory device can be prevented.

6 Claims, 8 Drawing Sheets

SEMICONDUCTOR MEMORY DEVICE HAVING FUNCTION OF GENERATING BOOSTED POTENTIAL

BACKGROUND OF THE INVENTION

1. Field of the Invention

The present invention relates to a semiconductor memory device, and in particular to a semiconductor memory device having a circuit for outputting a boosted potential.

2. Description of the Background Art

Semiconductor memory devices such as a DRAM are provided with a boosted potential generating circuit for supplying a boosted potential, e.g., to word lines.

Figure 11:
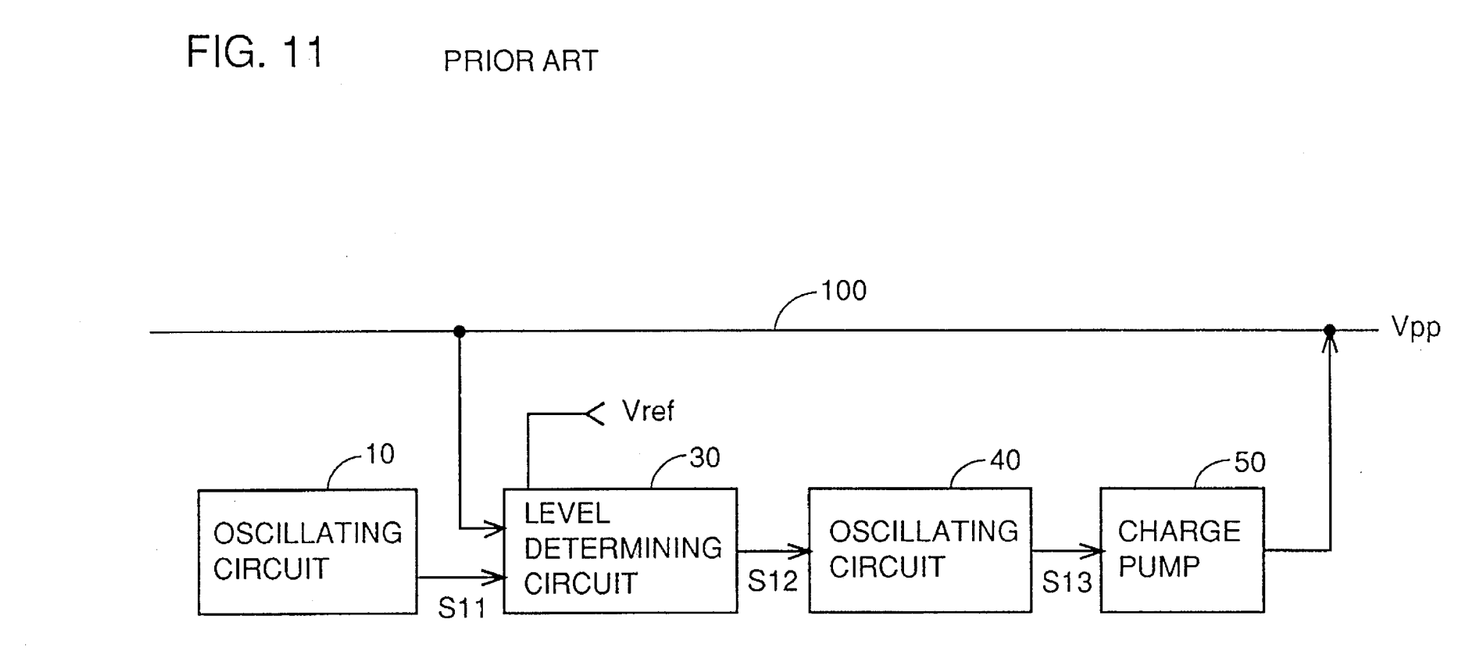
FIG. 11 is a block diagram showing a structure of a boosted potential generating circuit in a conventional semiconductor memory device.

FIG. 11 is a block diagram showing a structure of a boosted potential generating circuit in a conventional semiconductor memory device. Referring to FIG. 11, the boosted potential generating circuit includes an oscillating circuit 10, a level determining circuit 30, an oscillating circuit 40, a charge pump 50 and a boosted potential node 100.

Oscillating circuit 10 performs oscillation to produce a pulse signal S11 having a first predetermined cycle. Level determining circuit 30 receives pulse signal S11, a potential Vpp of boosted potential node 100 and a reference potential Vref. Reference potential Vref is supplied from a predetermined potential generating circuit (not shown).

Level determining circuit 30 makes comparison between potential Vpp and reference potential Vref in accordance with a cycle defined by pulse signal S11. As a result of the comparison, level determining circuit 30 determines a relative level (i.e., high or low) of potential Vpp with respect to reference potential Vref, and outputs a signal S12 indicative of the result of determination. Level determining circuit 30 determines the level of potential Vpp in response to a fall of pulse signal S11.

Oscillating circuit 40 receives signal S12 and performs oscillation to produce a pulse signal S13 having a predetermined second cycle in response to signal S12. Charge pump 50 receives pulse signal S13. Charge pump 50 is driven in response to pulse signal S13 to supply electric charges to boosted potential node 100. A boosted potential is supplied from boosted potential node 100.

Operation of the boosted potential generating circuit in FIG. 11 will be described below.

Figure 12:
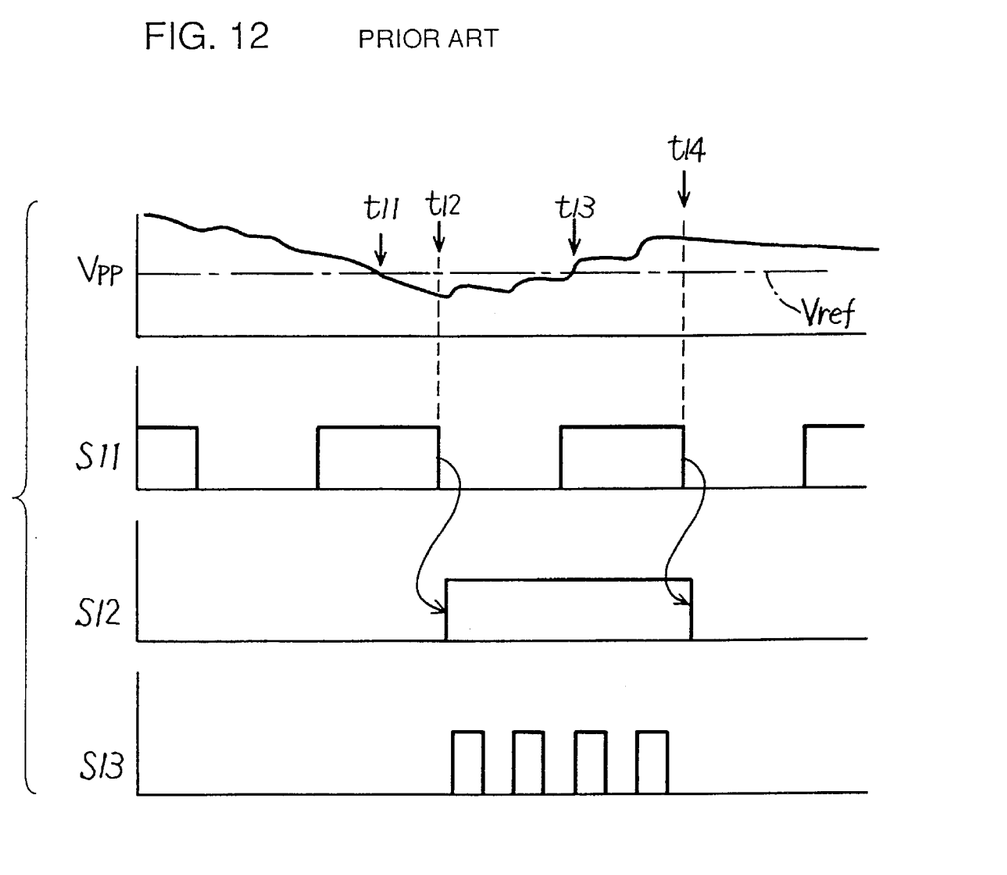
FIG. 12 is a timing chart showing signals of various portions of the boosted potential generating circuit in FIG. 11 during operation.

FIG. 12 is a timing chart showing signals of various portions of the boosted potential generating circuit in FIG. 11 during operation. In FIG. 12, there are shown potential Vpp and pulse signals S11, S12 and S13.

At time t11 in FIG. 12, the level of potential Vpp lowers below reference potential Vref due to leak of the current or the like. At a subsequent time t12 for the level determination, level determining circuit 30 determines that potential Vpp is lower than reference potential Vref.

Thereby, signal S12 sent from level determining circuit 30 attains the H-level. The H-level of signal S12 means the result of determination that potential Vpp is lower than reference potential Vref.

In response to the H-level of signal S12, oscillating circuit 40 starts oscillation of pulse signal S13. Thereby, charge pump 50 starts the operation. Owing to the operation of charge pump 50, the level of potential Vpp of boosted potential node 100 rises in stepwise fashion.

At time t13, potential Vpp exceeds reference potential Vref. Signal S12 sent from level determining circuit 30 is held at the H-level until next level determination starts at time t14. Therefore, charge pump 50 continues its operation until the start of next level determination.

In the conventional boosted potential generating circuit stated above, charge pump 50, which was once operated, will not stop its operation until the next determination timing even, if the potential Vpp is restored to or above reference potential Vref during the determination cycle. Thus, charge pump 50 operates wastefully. Therefore, such problems arise in the conventional boosted potential generating circuit that overshoot of potential Vpp of the boosted potential node may occur and the power consumption is large.

SUMMARY OF THE INVENTION

An object of the invention is to reduce a power consumption of a semiconductor memory device. It is also an object of the invention to prevent overshoot of a boosted potential in a semiconductor memory device.

A semiconductor memory device according to the invention includes a boosted potential node, a determination cycle control circuit, a level determining circuit, a drive pulse oscillating circuit and a charge pump circuit.

The boosted potential node is provided for outputting a boosted potential. The determination cycle control circuit outputs a control pulse signal having a controllable cycle for defining a cycle used for determining a level of the potential of the boosted potential node.

The level determining circuit compares the potential of the boosted potential node with a predetermined reference potential to determine a relative level of the potential of the boosted potential node with respect to the reference potential in accordance with a determination cycle defined by the control pulse signal output from the determination cycle control circuit.

The drive pulse oscillating circuit oscillates a drive pulse signal when the level determining circuit determines that the potential of the boosted potential node is lower than the reference potential. The charge pump circuit is driven to supply an electric charge for raising the potential of the boosted potential node to the boosted potential node in response to the drive pulse signal output from the drive pulse oscillating circuit.

The determination cycle control circuit outputs a control pulse signal of a first cycle in response to the determination by the level determining circuit that the potential of the boosted potential node is equal to or higher than the reference potential, and outputs the control pulse signal of a second cycle shorter than the first cycle in response to the determination by the level determining circuit that the potential of the boosted potential node is lower than the reference potential.

As described above, the level determining circuit compares the potential of the boosted potential node with the reference potential in accordance with the determination cycle defined by the control pulse signal output from the determination cycle control circuit. When it is determined that the potential of the boosted potential node is lower than the reference potential, the drive pulse oscillating circuit oscillates the drive pulse signal in response to the result of determination. In response to the drive pulse signal the charge pump circuit is driven.

The determination cycle control circuit outputs the control pulse signal of the first cycle when the level determining circuit determines that the potential of the boosted potential node is equal to or higher than the reference potential, and outputs the control pulse signal of the second cycle when the potential of the boosted potential node is lower than the reference potential. In this manner, the cycle of the control pulse signal is switched.

The second cycle of the control pulse signal is shorter than the first cycle. Therefore, when it is determined that the potential of the boosted potential node is lower than the reference potential, the cycle of the control pulse signal is reduced below the cycle which is set when it is determined that the potential of the boosted potential node is equal to or higher than the reference potential.

While the charge pump is being driven, the level determining cycle of the level determining circuit is shorter than that in the case where the charge pump is not driven. As described above, the level determination is performed in accordance with a short cycle while the charge pump circuit is being driven, so that the charge pump circuit can be stopped rapidly when the potential of the boosted potential node is restored to or above the reference potential. Therefore, overshoot of the potential of the boosted potential node can be suppressed.

The semiconductor memory device may further include a reference pulse oscillating circuit for oscillating a reference pulse signal to set the first cycle, in which case the determination cycle control circuit receives the reference pulse signal and the drive pulse signal, and operates to output, as the control pulse signal of the first cycle, a signal of the same cycle as the reference pulse signal in response to the determination by the level determining circuit that the potential of the boosted potential node is equal to or higher than the reference potential, and output, as the control pulse signal of the second cycle, a signal of the same cycle as the drive pulse signal in response to the determination by the level determining circuit that the potential of the boosted potential node is lower than the reference potential.

According to this structure, the determination cycle control circuit selectively outputs, as the control pulse signal, the signal of the same cycle as the reference pulse signal oscillated by the reference pulse oscillating circuit and the signal of the same cycle as the drive signal oscillated by the drive pulse oscillating circuit.

The signal of the same cycle as the reference pulse signal is output as the control signal, when the level determining circuit determines that the potential of the boosted potential node is equal to or higher than the reference potential. The signal of the same cycle as the drive pulse signal, of which cycle is shorter than that of the reference pulse signal, is output as the control pulse signal when the level determining circuit determines that the potential of the boosted potential node is lower than the reference potential.

As described above, the drive pulse signal for driving the charge pump circuit is also used for defining the cycle of level determination of the potential of the boosted potential node. In the determination cycle control circuit, therefore, the cycle of the control pulse signal can be controlled.

Further, the level determining circuit may output a signal, which attains a first level when the potential of the boosted potential node is equal to or higher than the reference potential, and attains a second level when the potential of the boosted potential node is lower than the reference potential. Moreover, the determination cycle control circuit may include first and second gate circuits.

The first gate circuit receives the reference pulse signal and the output signal of the level determining circuit, and outputs the reference pulse signal when the output signal of the level determining circuit is at the first level. The second gate circuit receives the output signal of the first gate circuit and the drive pulse signal, and outputs, as the control pulse signal, a signal indicative of logical OR of these signals.

According to this structure, the first gate circuit outputs the reference pulse signal when the level determining circuit determines that the potential of the boosted potential node is equal to or higher than the reference potential, and the signal of the same cycle as the reference pulse signal thus output is output as the control pulse signal from the second gate circuit.

Meanwhile, when the level determining circuit determines that the potential of the boosted potential node is lower than the reference potential, the first gate circuit masks the reference pulse signal, and the second gate circuit outputs, as the control signal, the signal of the same cycle as the drive pulse signal.

Therefore, the control pulse signal can be a pulse signal responsive to the reference pulse signal of a long cycle, when the potential of the boosted potential node is equal to or higher than the reference potential, and can be a signal responsive to the drive pulse signal of a short cycle, when the potential of the boosted potential node is lower than the reference potential.

The first gate circuit may include an inverter circuit and a logical gate circuit. The inverter circuit inverts and outputs the output signal of the level determining circuit. The logical gate circuit receives the output signal of the inverter circuit and the reference pulse signal, and outputs a signal indicative of AND of these signals.

According to the above structure, the first gate circuit outputs, from the logical gate circuit, the signal indicative of AND of the input reference pulse signal and the signal formed by inverting the output signal of the level determining circuit by the inverter circuit.

Therefore, in order to output the control pulse signal when it is determined that the potential of the boosted potential node is equal to or higher than the reference potential, the signal responsive to the reference pulse signal can be supplied to the second gate circuit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will be described below with reference to the drawings.

Figure 1:
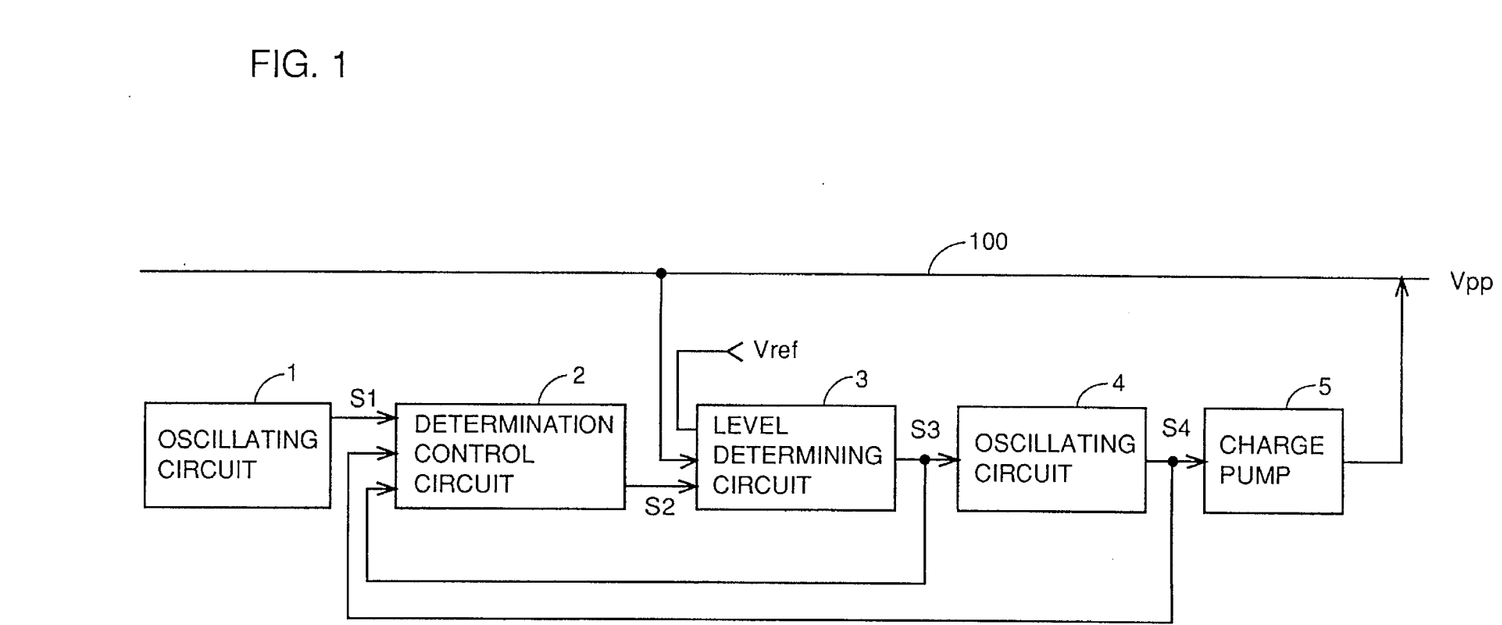
FIG. 1 is a block diagram showing a structure of a boosted potential generating circuit in a semiconductor memory device of an embodiment of the invention.

FIG. 1 is a block diagram showing a structure of a boosted potential generating circuit in a semiconductor memory device of an embodiment of the invention.

Referring to FIG. 1, the boosted potential generating circuit includes an oscillating circuit 1, a determination control circuit 2, a level determining circuit 3, an oscillating circuit 4, a charge pump 5 and a boosted potential node 100. Oscillating circuit 1 forms reference pulse oscillating means. Determination control circuit 2 forms determination cycle control means. Oscillating circuit 4 forms drive pulse signal oscillating means.

A major difference between the boosted potential generating circuit in FIG. 1 and that in FIG. 11 is provision of determination control circuit 2.

Oscillating circuit 1 oscillates a reference pulse signal S1 to attain a predetermined first cycle. Determination control circuit 2 receives reference pulse signal S1, a signal S3 sent from level determining circuit 3 and a drive pulse signal S4 sent from oscillating circuit 4. In response to these signals, determination control circuit 2 outputs a control pulse signal S2 defining a determination cycle (determination timing) of level determining circuit 3.

Level determining circuit 3 receives control pulse signal S2, potential Vpp of boosted potential node 100 and reference potential vref. Reference potential Vref is supplied from an appropriate potential generating circuit (not shown).

Level determining circuit 3 makes comparison between the levels of potential Vpp and reference potential Vref in accordance with the cycle defined by control pulse signal S2. By the comparison between the potential levels, level determining circuit 3 determines a relative level (i.e., high or low) of potential Vpp with respect to reference potential Vref, and outputs a signal S3 indicative of the result of determination.

Oscillating circuit 4 receives signal S3. In response to the level of signal S3, oscillating circuit 4 oscillates a drive pulse signal S4, which can form a pulse signal of a second cycle shorter than the oscillating cycle of oscillating circuit 1. Drive pulse signal S4 is used for driving charge pump 5.

Charge pump 5 receives drive pulse signal S4. Charge pump 5 operates in response to a pulse of drive pulse signal S4, and supplies electric charges to boosted potential node 100.

Figure 2:
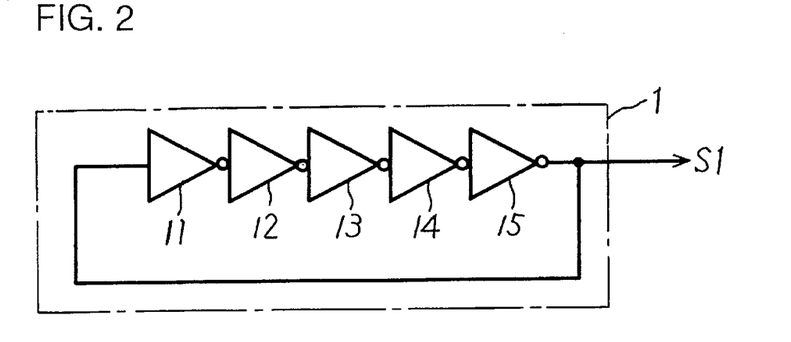
FIG. 2 is a circuit diagram showing a structure of a first oscillating circuit in FIG. 1.

FIG. 2 is a circuit diagram showing a structure of first oscillating circuit 1 in FIG. 1. Referring to FIG. 2, oscillating circuit 1 includes odd inverters 11–15. These inverters 11–15 are connected together in series and in a ring-like form. Oscillating circuit 1 is formed by utilizing the fact that oscillation occurs because connections between the inverters do not have a stable point.

Oscillating circuit 1 outputs the pulse signal of a predetermined cycle, i.e., reference pulse signal S1. The cycle of reference pulse signal S1 is defined by the number of inverters included in oscillating circuit 1.

Figure 3:
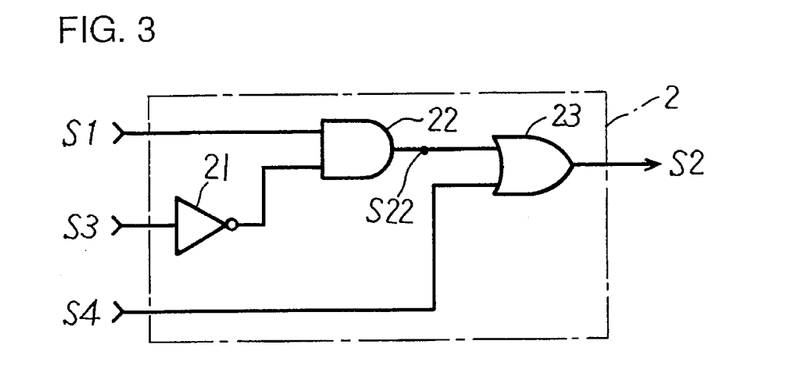
FIG. 3 is a circuit diagram showing a structure of a determination control circuit in FIG. 1.

FIG. 3 is a circuit diagram showing a structure of a determination control circuit 2 in FIG. 1. Referring to FIG. 3, determination control circuit 2 includes an inverter 21, an AND gate 22 and an OR gate 23.

AND gate 22 receives reference pulse signal S1 and a signal formed by inverting signal S3 by inverter 21. AND gate 22 outputs a signal S22 indicative of AND of these signals. OR gate 23 receives signal S22 and drive pulse signal S4, and outputs OR of these signals as control pulse signal S2.

Figure 4:
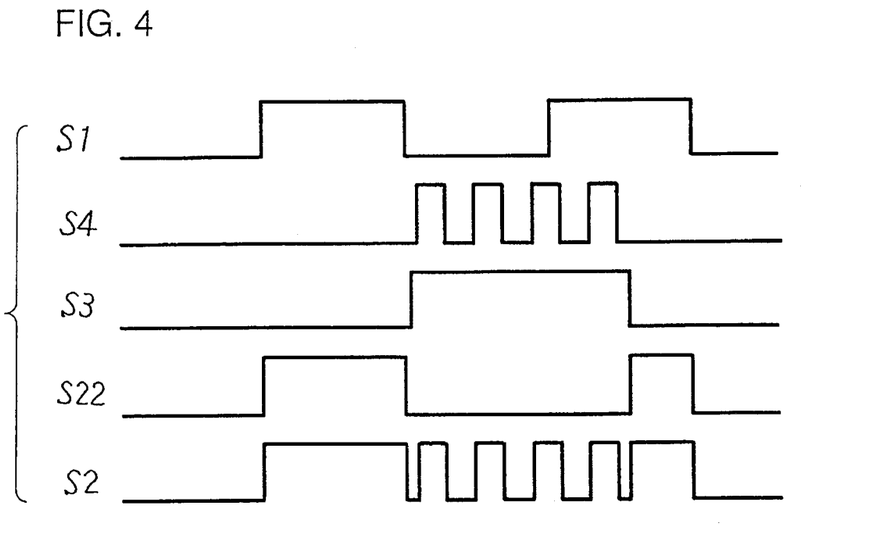
FIG. 4 is a timing chart showing waveforms of various portions of the determination control circuit in FIG. 3 during operation.

FIG. 4 is a timing chart showing waveforms of various portions of determination control circuit 2 in FIG. 3 during operation.

Referring to FIG. 4, when signal S3 output from level determining circuit 3 is at the H-level, determination control circuit 2 outputs control pulse signal S2 in the following manner. Determination control circuit 2 masks reference pulse signal S1 sent from oscillating circuit 1, and outputs control signal S2 synchronized with drive pulse signal S4 sent from oscillating circuit 4.

Meanwhile, when the level of signal S3 sent from level determining circuit 3 is at the L-level, determination control circuit 2 outputs control pulse signal S2 in the following manner. Determination control circuit 2 does not mask reference pulse signal S1 sent from oscillating circuit 1, and outputs control pulse signal S2 synchronized with reference pulse signal S1 sent from oscillating circuit 1. The reason for this is that drive pulse signal S4 is not oscillated when signal S3 is at the L-level.

Figure 5:
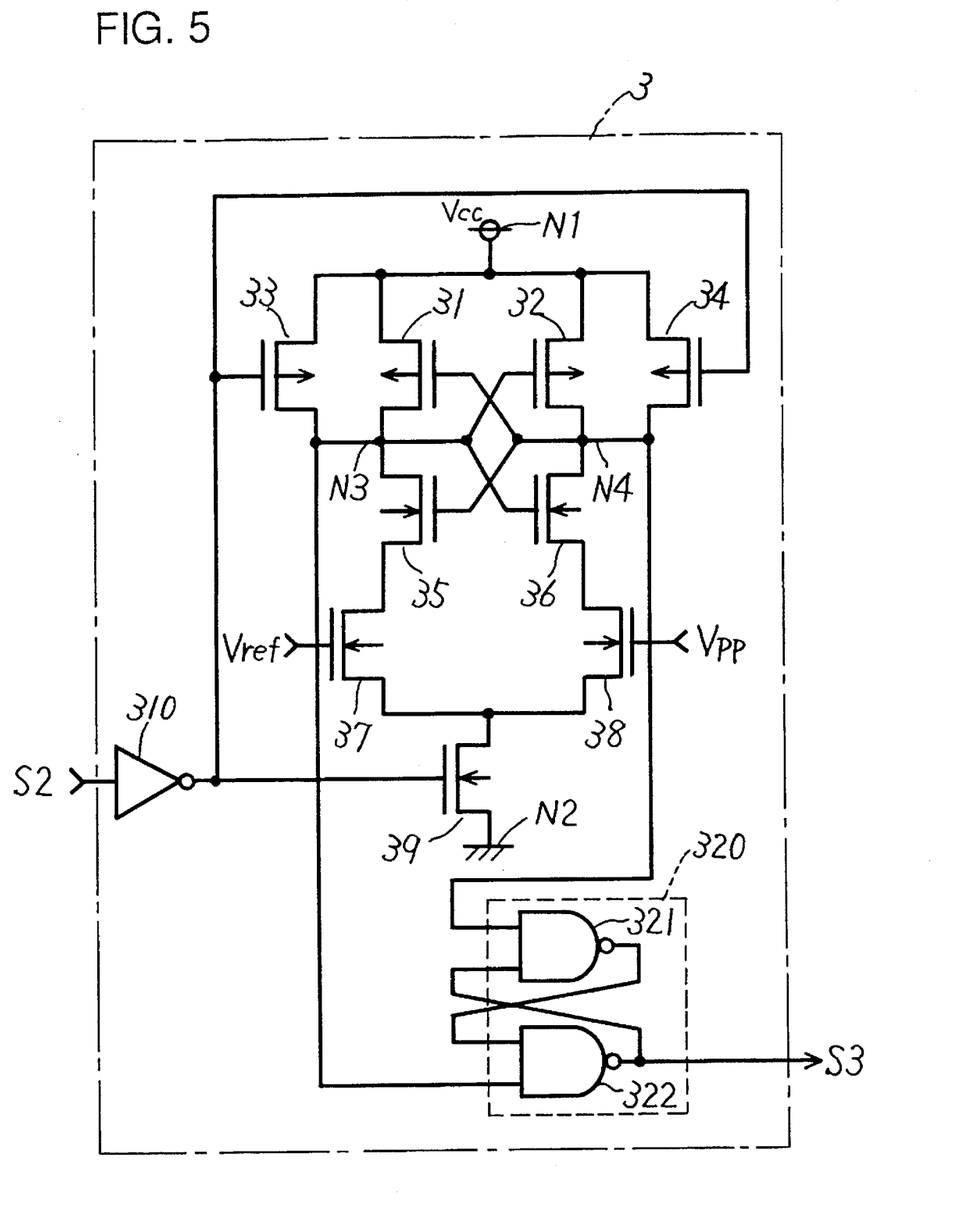
FIG. 5 is a circuit diagram showing a structure of a level determining circuit in FIG. 1.

FIG. 5 is a circuit diagram showing a structure of level determining circuit 3. Referring to FIG. 5, level determining circuit 3 includes P-channel MOS transistors 31–34, N-channel MOS transistors 35–39, NAND gates 321 and 322, and an inverter 310.

A power supply node N1 receives a power supply potential Vcc. A ground node N2 receives a ground potential (0 V). Transistors 31, 35, 37 and 39 are connected in series between power supply node N1 and ground node N2. Transistors 32, 36 and 38 are connected in series between power supply node N1 and transistor 39.

Both gate electrodes of transistors 32 and 36 are connected to a node N3 between transistors 31 and 35. Both gate electrodes of transistors 31 and 35 are connected to a node N4 between transistors 32 and 36. Transistors 31, 32, 35 and 36 connected in this manner form a dynamic latch circuit.

Transistor 37 receives reference potential Vref on its gate electrode. Transistor 38 receives potential Vpp of boosted potential node 100 on its gate. Transistors 37 and 38 have the same size. Transistor 39 receives on its gate electrode a signal formed by inverting control signal S2 by inverter 310.

Transistor 33 is connected between power supply node N1 and one of input terminals of NAND gate 322. Transistor 33 has a drain electrode connected to node N3. Transistor 33 receives on its gate electrode the signal formed by inverting control pulse signal S2 by inverter 310.

Transistor 34 is connected between power supply node N1 and one of the input terminals of NAND gate 321. Transistor 34 has a drain electrode connected to node N4. Transistor 34 receives on its gate electrode the signal formed by inverting control pulse signal S2 by inverter 310.

The other input terminal of NAND gate 322 is connected to the output terminal of NAND gate 321. The other input terminal of NAND gate 321 is connected to the output terminal of NAND gate 322. NAND gates 321 and 322 form a latch circuit 320.

Figure 6:
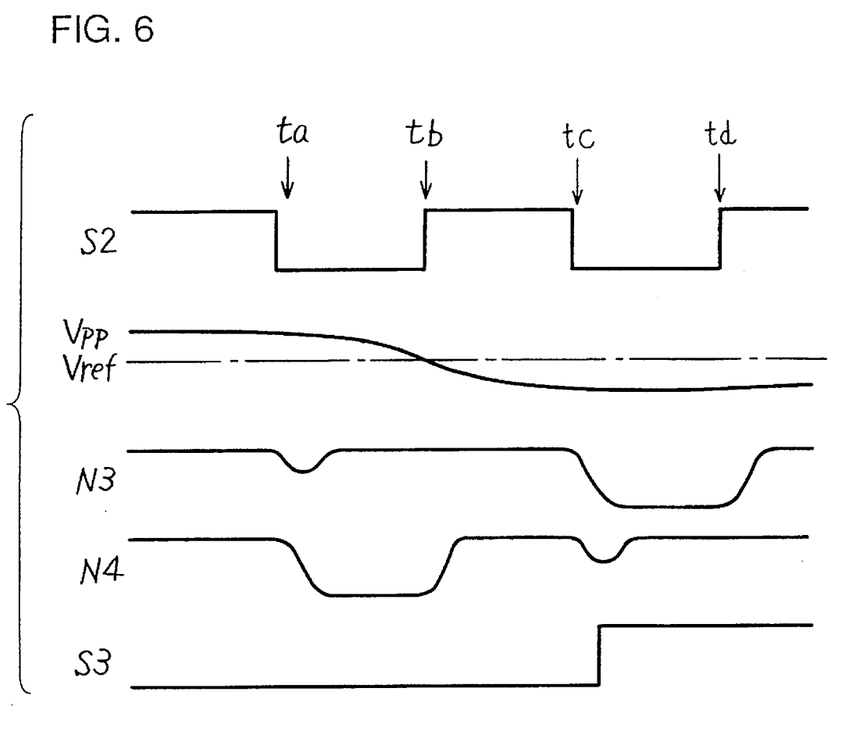
FIG. 6 is a timing chart showing waveforms of various portions of a level determining circuit in FIG. 5 during operation.

Description will be given on operation of the level determining circuit in FIG. 5. FIG. 6 is a timing chart showing waveforms of various portions of level determining circuit 3 in FIG. 1 during operation. The operation will be described below with reference to FIGS. 5 and 6.

Referring to FIG. 6, when control pulse signal S2 is at the H-level, both transistors 33 and 34 are turned on. Thereby, both nodes N3 and N4 are precharged to the H-level. When control pulse signal S2 attains the L-level, both transistors 33 and 34 are turned off, and transistor 39 is turned on.

As stated before, transistors 37 and 38 have the same size. Therefore, the drain currents of transistors 37 and 38 differ from each other when different potentials are applied to their gate electrodes. More specifically, when potential Vpp of boosted potential node 100 is different from reference potential Vref, different drain currents flows in transistors 37 and 38.

For example, as shown at time ta in FIG. 6, if potential Vpp is higher than reference potential Vref when input signal S2 lowers to the L-level, the drain current value of transistor 38 receiving potential Vpp on its gate electrode is larger than the drain current value of transistor 37 receiving reference potential vref on its gate electrode.

In the dynamic latch circuit formed of transistors 31, 32, 35 and 36, therefore, node N3 attains the H-level, and node N4 attains the L-level. In this case, data at the L-level is set in latch circuit 320. Thereby, signal S3 output from latch circuit 320 attains the L-level.

At time tb in FIG. 6, when input control pulse signal S2 attains the H-level, latch circuit 320 performs holding operation. Thereby, latch circuit 320 holds the data at the L-level which was set as described before. Therefore, signal S3 output from latch circuit 320 continues to be held at the L-level.

As shown at time tc in FIG. 6, when potential Vpp is lower than reference potential Vref, the drain current value of transistor 37 receiving reference potential Vref on its gate electrode is larger than the drain current value of transistor 38 receiving potential vpp on its electrode.

In the dynamic latch circuit formed of transistors 31, 32, 35 and 36, therefore, node N4 attains the H-level, and node N3 attains the L-level. In this case, data at the H-level is set in latch circuit 320. Thereby, signal S3 output from latch circuit 320 attains the H-level.

At subsequent time td in FIG. 6, input control pulse signal S2 attains the H-level, and latch circuit 320 performs the holding operation. Thereby, latch circuit 320 holds the data at the H-level which was set as described before. Therefore, signal S3 output from latch circuit 320 is held at the H-level.

In this manner, level determining circuit 3 determines the level of potential Vpp of boosted potential node 100 in accordance with the timing of the rising edge of input control pulse signal S2.

Figure 7:
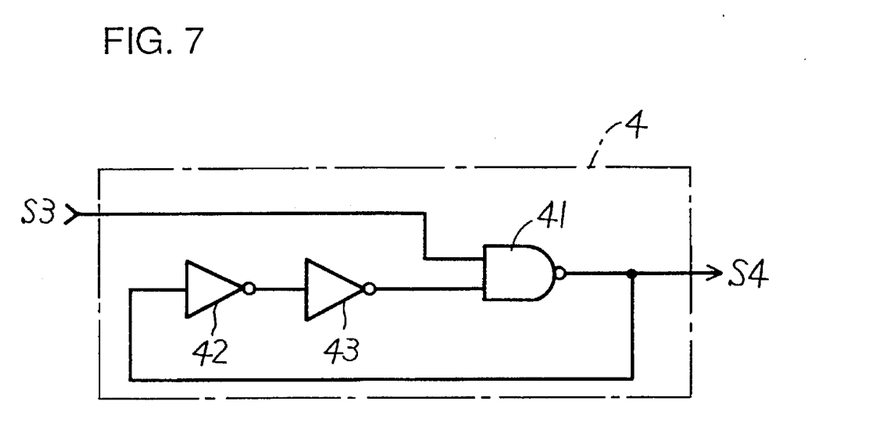
FIG. 7 is a circuit diagram showing a structure of a second oscillating circuit in FIG. 1.

FIG. 7 is a circuit diagram showing a structure of oscillating circuit 4 in FIG. 1. Referring to FIG. 7, oscillating circuit 4 includes an NAND gate 41 and two inverters 42 and 43.

Inverters 42 and 43 are connected in series between an output terminal of NAND gate 41 and one of input terminals of NAND gate 41. NAND gate 41 receives signal S3 sent from level determining circuit 3 on its other input terminal. Drive pulse signal S4 is output from NAND gate 41.

Operation of oscillating circuit 4 will now be described below. Referring to FIG. 4, when signal S3 is at the L-level, drive pulse signal S4 output from NAND gate 41 is fixed at the H-level. In this case, therefore, the pulse of drive pulse signal S4 is not oscillated.

When input signal S3 is at the H-level, NAND gate 41 operates as an inverter with respect to signal S3. When NAND gate 41 has the function as an inverter, oscillating circuit 4 has the same function as an oscillating circuit having three inverters. In this case, therefore, oscillating circuit 4 forms a circuit which has an oscillating function for producing drive pulse signal S4 of a shorter cycle than that produced by oscillating circuit 1 in FIG. 2 having five inverters.

Therefore, when oscillating circuit 4 oscillates the pulse signal in accordance with the same principle as the oscillating circuit 1 shown in FIG. 2, when the input signal S3 is at the H-level. In this case, therefore, drive pulse signal S4 output from oscillating circuit 4 forms a pulse-like signal.

Figure 8:
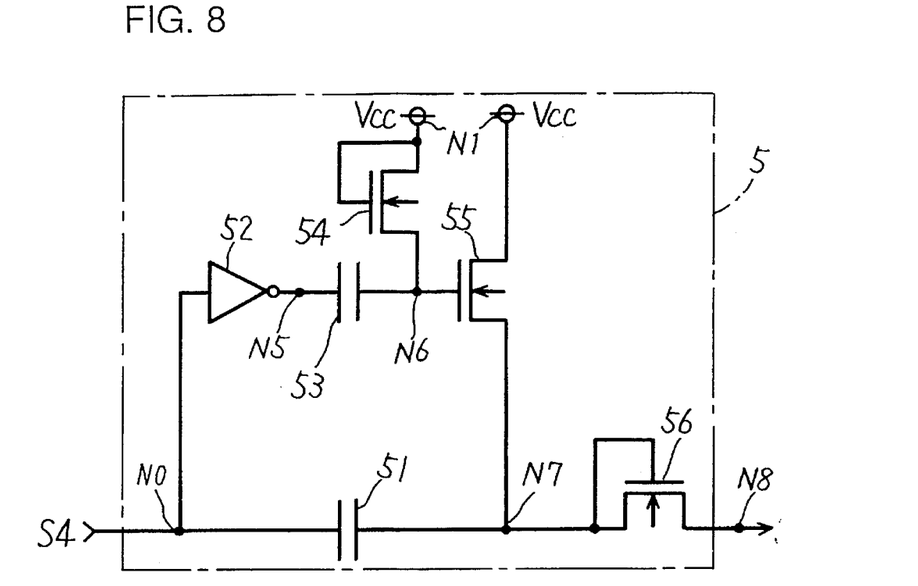
FIG. 8 is a circuit diagram showing a structure of a charge pump in FIG. 1.

FIG. 8 is a circuit diagram showing a structure of a charge pump 5 in FIG. 1. Referring to FIG. 8, charge pump 5 includes capacitors 51 and 53, an inverter 52 and N-channel MOS transistors 54, 55 and 56.

In charge pump 5, a capacitor 51 and a transistor 56 are connected in series between an input node N0 and an output node N8. Transistor 56 is diode-coupled in such a manner that its gate electrode is connected to its drain electrode which is located at the side of a node N7 between capacitor 51 and transistor 56.

Transistor 55 is connected between power supply node N1 receiving power supply potential Vcc and node N7. Inverter 52 and capacitor 53 are connected in series between input node N0 and the gate electrode of transistor 55.

In the following description, a node between inverter 52 and capacitor 53 is designated as node N5, and a node between capacitor 53 and the gate electrode of transistor 55 is designated as node N6.

Transistor 54 is connected between power supply node N1 and node N6. Transistor 54 is diode-coupled in such a manner that its gate electrode is connected to its drain electrode located at the side of power supply node N1.

Figure 9:
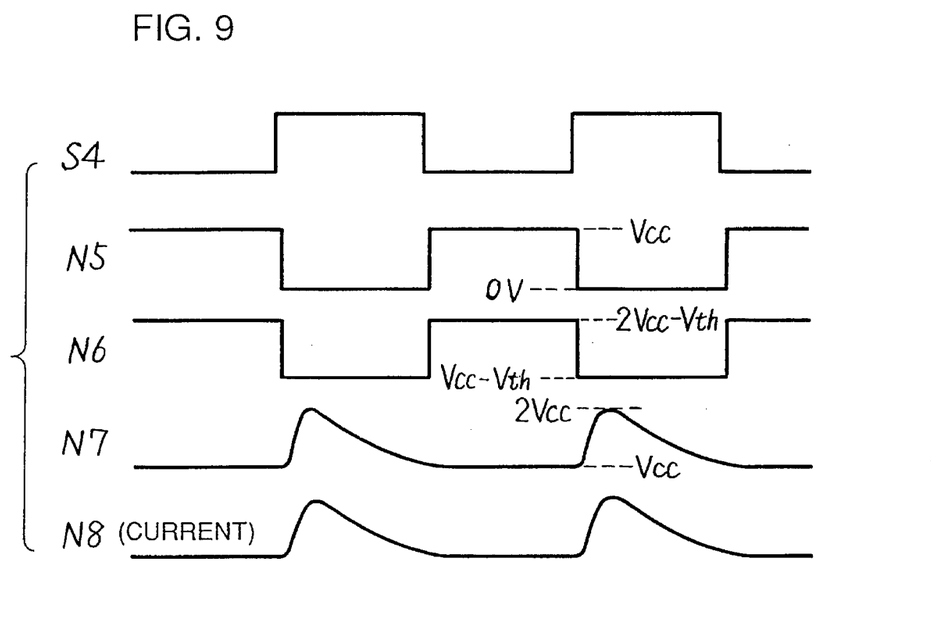
FIG. 9 is a timing chart of waveforms of various portions of the charge pump in FIG. 8 during operation.

Operation of charge pump 5 in FIG. 8 will now be described below. FIG. 9 is a timing chart showing waveforms of various portions during operation of the charge pump in FIG. 8.

Referring to FIG. 9, when drive pulse signal S4 which is supplied as a pulse signal is at the L-level, the potential of node N5 is equal to power supply potential Vcc. Node N6 has been precharged to Vcc–Vth, where Vth is a threshold voltage of the transistor.

Since the precharge has already been performed, the potential of node N6 is boosted to 2·Vcc–Vth owing to the coupling by capacitor 53 in this case. Thereby, transistor 55 is turned on, and node N7 is precharged to power supply potential Vcc.

When drive pulse signal S4 rises to the H-level, the potential of node N5 changes from power supply potential Vcc to 0 V, and the potential of node N6 returns to Vcc–Vth.

In this case, the potential of node N7 is boosted to 2·Vcc owing to the coupling by capacitor 51. A current flows through transistor 56 to output node N8. In response to this, the potential of node N7 decreases. In this case, transistor 55 is turned off because the voltage between the gate and source goes to −Vth.

In this manner, charge pump 5 supplies electric charges to boosted potential node 100 in response to the pulse of drive pulse signals S4 output from oscillating circuit 4, and thus raises its potential Vpp.

Figure 10:
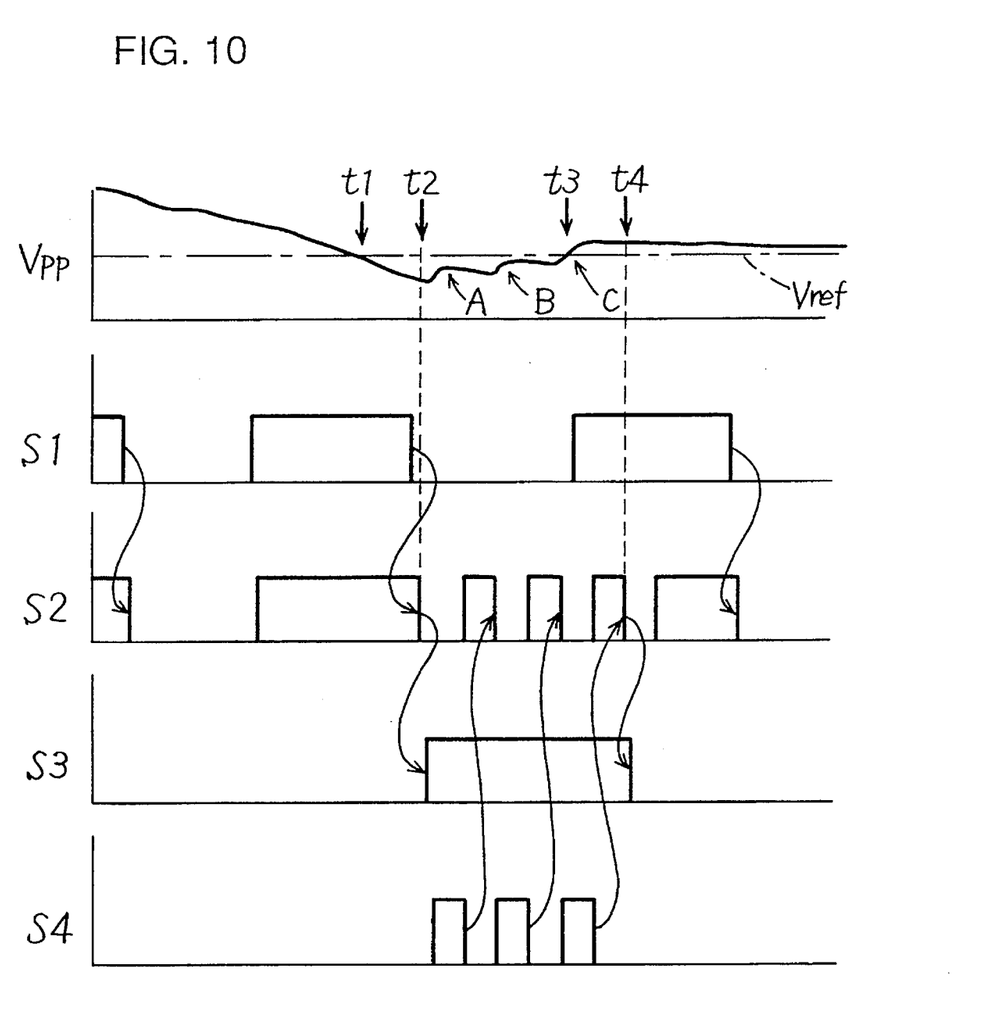
FIG. 10 is a timing chart showing general operation of the boosted potential generating circuit in FIG. 1.

General operation of the boosted potential generating circuit thus constructed will be described below. FIG. 10 is a timing chart showing general operation of the boosted potential generating circuit in FIG. 1. In FIG. 10, there are shown potential Vpp of boosted potential node 100, reference pulse signal S1, control pulse signal S2, signal S3 and drive pulse signal S4.

Referring to FIG. 10, oscillating circuit 1 oscillates reference pulse signal S1. When charge pump 5 is not operating, control pulse signal S2 output from determination control circuit 2 has the same cycle as reference pulse signal S1. Therefore, level determining circuit 3 performs the level determination of potential Vpp in accordance with the cycle of the pulses of reference pulse signal S1.

At time t1, potential Vpp of boosted potential node 100 decreases below reference potential Vref. Thereby, at time t2 of the next fall of control pulse signal S2, i.e., in the next level determining operation, level determining circuit 3 determines the level of potential Vpp. As a result of determination, signal S3 output from level determining circuit 3 attains the H-level.

In response to this, signal S4 output from oscillating circuit 4 forms the pulse signal. Thereby, charge pump 5 starts its operation. Consequently, as indicated at A, B and C in FIG. 10, potential Vpp rises and is restored toward reference potential Vref.

During operation of charge pump 5, control pulse signal S2 output from determination control circuit 2 has the same cycle as the pulse of drive pulse signal S4. Therefore, the level determination circuit 3 determines the level of potential Vpp in accordance with the cycle of the short pulse based on the drive pulse signal S4. Therefore, determination of the level of potential Vpp during operation of the charge pump 5 is performed in accordance with a cycle shorter than that during stoppage.

As a result of level determination of potential Vpp by level determining circuit 3 in the above case, signal S3 is held at the H-level when the potential Vpp is lower than reference potential Vref. Meanwhile, when potential Vpp is higher than reference potential Vref as can be seen at time t3, level determining circuit 3 will determine the level of potential Vpp at time t4 of next fall of control pulse signal S2, i.e., in the next level determining operation. As a result of determination, signal S3 output from level determining circuit 3 falls to the L-level.

In response to this, drive pulse signal S4 output from oscillating circuit 4 stops the oscillation in the pulse form. Thereby, charge pump 5 shops its operation.

In the boosted potential generating circuit in FIG. 1, as described above, the level determination of potential Vpp is performed in accordance with a long cycle during stop of charge pump 5, and the level determination of potential Vpp is performed in accordance with a short cycle during operation of charge pump 5.

In the boosted potential generating circuit, therefore, operation of the charge pump can be stopped rapidly when potential Vpp of boosted potential node 100 is restored to reference potential Vref by the operation of charge pump 5. Therefore, overshoot of potential Vpp can be prevented, and consequently, the power consumption of semiconductor memory device can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

a boosted potential node provided for outputting a boosted potential;

determination cycle control means for outputting a control pulse signal having a controllable cycle for defining a cycle used for determining a level of the potential of said boosted potential node;

level determining means for comparing the potential of said boosted potential node with a predetermined reference potential to determine a relative level of the potential of said boosted potential node with respect to the reference potential in accordance with a determination cycle defined by said control pulse signal output from said determination cycle control means;

drive pulse oscillating means for oscillating a drive pulse signal when said level determining means determines that the potential of said boosted potential node is lower than said reference potential; and charge pump means for being driven to supply an electric charge for raising the potential of said boosted potential node to said boosted potential node in response to the drive pulse signal output from said drive pulse oscillating means, wherein said determination cycle control means outputs a control pulse signal of a first cycle in response to the determination by said level determining means that the potential of said boosted potential node is equal to or higher than said reference potential, and outputs the control pulse signal of a second cycle shorter than said first cycle in response to the determination by said level determining means that the potential of said boosted potential node is lower than said reference potential.

2. The semiconductor memory device according to claim 1, further comprising reference pulse oscillating means for oscillating a reference pulse signal to set said first cycle, wherein said determination cycle control means receives said reference pulse signal and said drive pulse signal, and operates to output, as the control pulse signal of said first cycle, a signal of the same cycle as said reference pulse signal in response to the determination by said level determining means that the potential of said boosted potential node is equal to or higher than said reference potential, and output, as the control pulse signal of said second cycle, a signal of the same cycle as said drive pulse signal in response to the determination by said level determining means that the potential of said boosted potential node is lower than said reference potential.

3. The semiconductor memory device according to claim 2, wherein said level determining means outputs a signal attaining a first level when the potential of said boosted potential node is equal to or higher than said reference potential and attaining a second level when the potential of said boosted potential node is lower than said reference potential; and said determination cycle control means includes:

first gate means for receiving said reference pulse signal and the output signal of said level determining means, and outputting said reference pulse signal when the output signal of said level determining means is at said first level, and second gate means for receiving the output signal of said first gate means and said drive pulse signal, and outputting, as said control pulse signal, a signal indicative of OR of the received signals.

4. The semiconductor memory device according to claim 3, wherein said first gate means includes:

inverter means for inverting and outputting the output signal of said level determining means; and logical gate means for receiving the output signal of said inverter means and said reference pulse signal, and outputting a signal indicative of AND of the received signals.

5. The semiconductor memory device according to claim 3, wherein said level determining means includes:

first latch means being responsive to said control pulse signal to generate and hold a potential at said first level when the potential of said boosted potential node is equal to or higher than said reference potential, and to generate and hold a potential at said second level when the potential of said boosted potential node is lower than said reference potential; and second latch means being responsive to said control pulse signal to output the potential generated by said first latch means and hold the output state.

6. The semiconductor memory device according to claim 2, wherein said reference pulse oscillating means includes odd first inverter means for defining said first cycle, said drive pulse oscillating means includes odd second inverter means being operable as inverters for defining said second cycle, and the number of said first inverter means is larger than the number of said second inverter means.

\* \* \* \* \*